United States Patent
Rees (10) Patent No.: US 8,258,453 B2
(45) Date of Patent: Sep. 4, 2012

(54) LONG RANGE PROXIMITY AND/OR MOTION DETECTOR WITH AMBIENT LIGHT DETECTION CAPABILITIES

(75) Inventor: Theodore D. Rees, Mountain View, CA (US)

(73) Assignee: Intersil Americas Inc., Milpitas, CA (US)

( * ) Notice: Subject to any disclaimer, the term of this patent is extended or adjusted under 35 U.S.C. 154(b) by 317 days.

(21) Appl. No.: 12/767,443

(22) Filed: Apr. 26, 2010

(65) Prior Publication Data
US 2010/0277075 A1    Nov. 4, 2010

Related U.S. Application Data

(60) Provisional application No. 61/173,951, filed on Apr. 29, 2009.

(51) Int. Cl.
*G01V 8/00* (2006.01)

(52) U.S. Cl. .......... 250/214 AL; 250/214 B; 250/214 R; 250/221

(58) Field of Classification Search .............. 250/214 R, 250/214 AL, 214 B, 221, 559.22, 559.38; 356/4.01, 4.07, 5.01; 340/545.3, 552
See application file for complete search history.

(56) References Cited

U.S. PATENT DOCUMENTS

| | | | |
|---|---|---|---|
| 4,979,816 A | 12/1990 | White | |
| 5,834,765 A | 11/1998 | Ashdown | |
| 6,396,571 B2 | 5/2002 | Ohtomo et al. | |
| 7,110,092 B2 | 9/2006 | Kasper et al. | |
| 7,221,437 B1 | 5/2007 | Schaefer | |
| 7,486,386 B1 | 2/2009 | Holcombe et al. | |
| 7,495,746 B2 | 2/2009 | Bernard et al. | |
| 7,728,316 B2 * | 6/2010 | Fadell et al. | 250/559.38 |
| 2004/0085526 A1 | 5/2004 | Gogolla et al. | |
| 2008/0006762 A1 | 1/2008 | Fadell et al. | |
| 2008/0239325 A1 | 10/2008 | Cheng et al. | |
| 2009/0027652 A1 | 1/2009 | Chang et al. | |

OTHER PUBLICATIONS

International Search Report and Written Opinion for PCT/US2010/032685, dated Dec. 20, 2010.

* cited by examiner

Primary Examiner — Kevin Pyo
(74) Attorney, Agent, or Firm — Fliesler Meyer LLP (57) ABSTRACT

Provided herein are optical sensor systems that can be used for ambient light detection, proximity detection and motion detection, as well as to larger systems that include such an optical sensor system, and to related methods. In an embodiment, the optical sensor system includes a front end, an ambient light channel, a proximity channel and a motion channel. In an embodiment, offset and gain of the proximity channel is adjusted based on motion detected by the motion channel.

20 Claims, 5 Drawing Sheets

LONG RANGE PROXIMITY AND/OR MOTION DETECTOR WITH AMBIENT LIGHT DETECTION CAPABILITIES

PRIORITY CLAIM

This application claims priority under 35 U.S.C. 119(e) to U.S. Provisional Patent Application No. 61/173,951, entitled LONG RANGE PROXIMITY AND/OR MOTION DETECTOR WITH AMBIENT LIGHT DETECTION CAPABILITIES, filed Apr. 29, 2009, which is incorporated herein by reference.

BACKGROUND

Optical sensors, such as optical proximity sensors, may include a light source including one or more light emitting element (e.g., LEDs) and an adjacent photosensitive light detector, where the sensor can estimate proximity of an object based on the magnitude of reflected light from the one or more LED returning to the sensor. The value of these sensors has become more important in the recent past with the advent of battery-operated handheld devices, such as mobile phones. For example, a fair amount of the energy from a mobile phone battery is used to drive the display, and there is value in turning off the display or backlight when the mobile phone or other device is brought to the user's ear (where it cannot be viewed anyway). Optical proximity sensors have been used for this, and many other applications.

For other examples, there are many other applications in which the presence of an object can be detected with an optical proximity sensor to advantage. These range from sensing when protective covers have been opened on machinery, paper has been positioned correctly in a printer, or an operator's hands are at risk near an operating machine. An optical proximity sensor can also be used as a simple touch or near-touch activated switch, and could be implemented in applications like keyboards or devices that have a plastic housing that is sealed but which allows the light from the source to pass through and be sensed by the detector on the return.

Various different forms of optical sensors are available to detect the presence or absence of an object. For instance some optical sensors are configured to sense motion and turn on a light when motion is detected. Some optical sensors are configured to sense ambient light and turn on a light when it is dark. For another example, auto-focus cameras are often configured with an infrared LED and use the light received through the camera optics to perform auto focus in dim light conditions. Further, photo interrupter modules exist in many forms to detect the passage of an object between a light source and a light detector. For example, garage door openers (which are also used to close garage doors) often use an infrared (IR) light source and a remote light detector to prevent objects or persons from being crushed under a closing garage door. These are just a few examples of the various types and uses of optical sensors.

SUMMARY

Specific embodiments of the present invention relate to optical sensor systems that can be used for ambient light detection, proximity detection and motion detection, as well as to larger systems that include such an optical sensor system, and to related methods.

In accordance with an embodiment of the present invention, an optical sensor system includes a front end, an ambient light channel, a proximity channel and a motion channel. The front end is configured to receive a detected light signal generated using a light detector, wherein the detected light signal is indicative of both detected ambient light as well as detected radio frequency (RF) light produced by a light source (which has been reflected off of one or more object). Additionally, the front end is configured to output a detected ambient light signal (ALS) and a detected RF light signal. The detected ALS output by the front end is primarily indicative of the portion of the detected light signal that is indicative of detected ambient light. The detected RF light signal output by the front end is primarily indicative of the portion of the detected light signal that is indicative of detected RF light. A distinction between the detected ALS and the detected RF light signal is that the detected ambient light signal includes the low frequency components of the detected light signal, whereas the detected RF light signal includes the high frequency components of detected light signal resulting from light originating from the light source. The detected RF light can be due to light reflected off of one or more stationary object as well as light reflected off of one or more moving object. The ambient channel can be configured to produce one or more ambient output signal indicative of the ambient light detected. The proximity channel can be configured to produce one or more proximity output signal indicative of proximity of an object relative to the system, in dependence on the detected RF light signal. The motion channel can be configured to produce one or more motion output signal indicative of motion of an object relative to the system, in dependence on the detected RF light signal.

In accordance with an embodiment, the optical sensor system can also include circuitry configured to amplify and filter the detected RF light signal (output by the front end) and to output an amplified and filtered RF light signal that is provided to both the proximity channel and the motion channel. The circuitry configured to amplify and filter the detected RF light signal can include gain circuitry, a demodulator and a low pass filter. The gain circuitry can be configured to receive the detected RF light signal from the front end and amplify the detected RF light signal. The demodulator can be configured to receive the signal output by the gain circuitry and output a signal having low frequency content proportional to the RF amplitude of the amplified RF light signal and including high frequency artifacts. The low pass filter can be configured to receive the signal output by the demodulator and output a signal indicative of the low frequency content of the amplified RF light signal with the high frequency artifacts filtered out. The proximity channel and the motion channel can each receive the signal output by the low pass filter.

In accordance with an embodiment, the optical sensor system can also include a driver configured to drive the light source, and one or more timing circuit configured to control timing of the demodulator and the driver. In a specific embodiment, the one or more timing circuit drives the light source such that the light source produces a pulsed light signal having a frequency of, e.g., at least 1 MHz.

In accordance with an embodiment, a gain of the motion channel is set greater than a gain of the proximity channel so that a maximum distance at which the motion channel can detect motion of an object is greater than a maximum distance at which the proximity channel can detect presence of the object.

In accordance with an embodiment, offset and gain of the proximity channel is adjusted based on motion detected by the motion channel. For example, the offset and the gain of the proximity channel can be adjusted based on motion detected by the motion channel so that the proximity channel distinguishes between an object of interest that has moved in a field of view of the system from a stationary object not of interest in the field of view of the system.

Further and alternative embodiments, and the features, aspects, and advantages of the embodiments of invention will become more apparent from the detailed description set forth below, the drawings and the claims.

DETAILED DESCRIPTION

In accordance with an embodiment of the present invention, an integrated optical sensor includes an integrated or remote light source (e.g., LED) that is configured in a system to provide for multiple applications, including: detecting ambient light levels, detecting the proximity of an object or person (based on the amount of light transmission between the light source and the light detector), and detecting motion (based on a transient change in the light transmission between the light source and the light detector). In accordance with an embodiment, the proximity detection and motion detection functions are completely or substantially independent of the ambient light detection, although all three functions can share the same light detector. In accordance with an embodiment the system includes a control interface, which can be, e.g., a serial interface. In another embodiment, the system does not include the control interface. In accordance with an embodiment the output of the system is analog. In another embodiment the output of the system is digital, which output can be provided via a serial interface, but need not be.

A feature of specific embodiments of the present invention is the combination of elements to form a detection system that is useful in a variety of detection operations.

Figure 1:
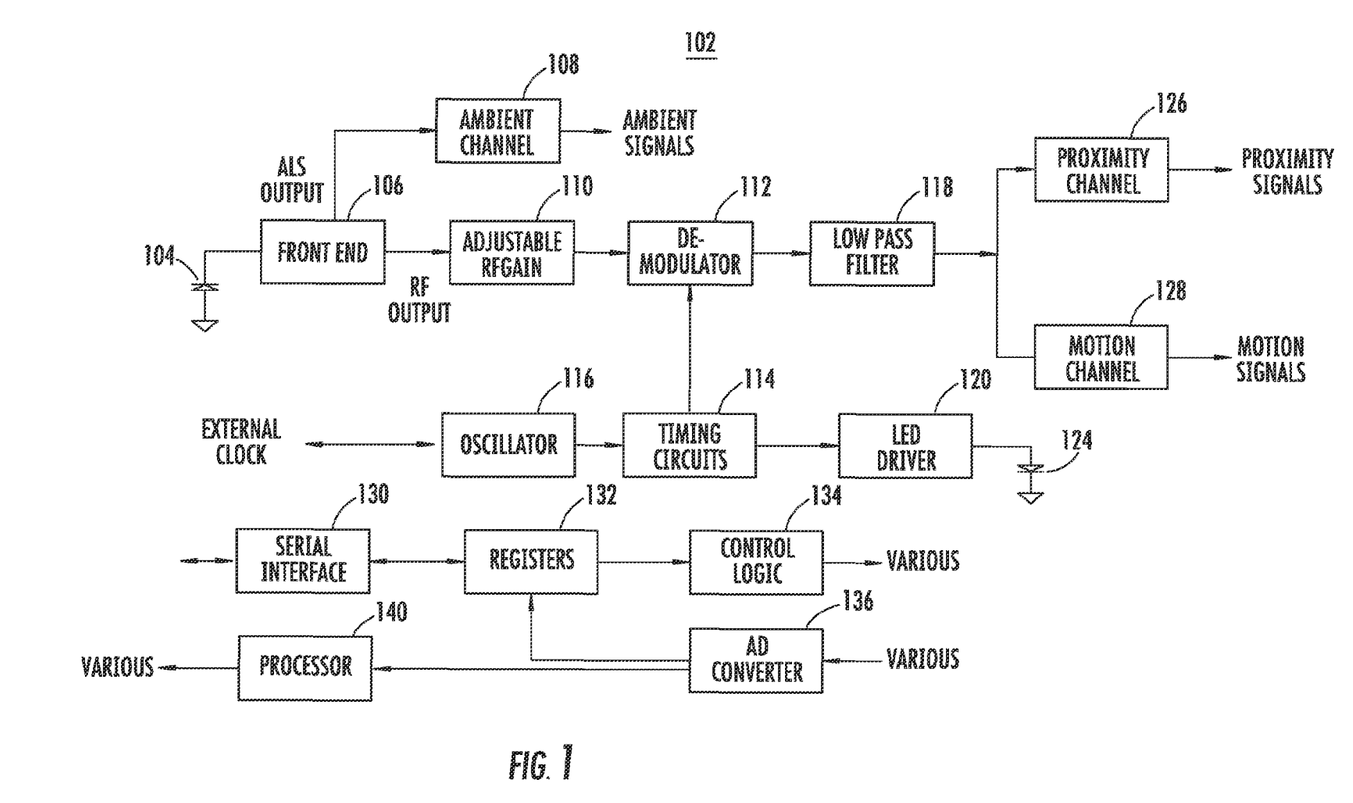
FIG. 1 is a block diagram of an optical sensor system, according to an embodiment of the present invention.

FIG. 1 is a block diagram of an optical sensor system 102, according to an embodiment of the present invention. At the upper left is a light detector 104 (e.g., a photo diode) that is back biased and connected to a front end 106. The front end 106, which is described in more detail below, can separate the portion of a detected light signal that is in response to ambient light (also referred to the detected ambient light signal) from the portion of the detected light signal that is in response to the RF light (also referred to as the detected RF signal) produced by the light source 124 (e.g., the light source is pulsed at an RF frequency, e.g., between 1 MHz and 10 MHz that is greater than the frequencies and expected harmonics of ambient light).

Preferably, the light source 124, e.g., an infrared light emitting diode (IR LED) and the light detector 104 are arranged relative to one another such that no light can travel directly from the light source 124 to the light detector 104. Rather, the light detector 104 should preferably only detect light from the light source 124 that has been reflected off an object in proximity to the optical sensor system 102. As the term is used herein, ambient light refers to background light, i.e., light already existing in an indoor or outdoor setting that is not caused by light produced by the light source 124. Such ambient light includes radiation over a wide range of wavelengths, including IR wavelengths.

In accordance with an embodiment, the front end 106 can be configured to receive a detected light signal generated using the light detector 104, where the detected light signal is indicative of both detected ambient light as well as detected radio frequency (RF) light produced by the light source 124. Additionally, the front end 106 can be configured to output an ambient light signal (also referred to as an ALS output) and an RF light signal (also referred to as an RF output). The detected ambient light signal output by the front end 106 is primarily indicative of the portion of the detected light signal that is indicative of detected ambient light. The detected RF light signal output by the front end 106 is primarily indicative of the portion of the detected light signal that is indicative of detected RF light. The detected RF light can be due to light reflected off of one or more stationary object as well as light reflected off of one or more moving object. A distinction between the detected ambient light signal and the detected RF light signal is that the detected ambient light signal includes the low frequency components of the detected light signal, whereas the detected RF light signal includes the high frequency components of detected light signal resulting from light originating from the light source.

The detected ambient light signal can be pre-amplified and presented to and processed in an ambient channel 108. The detected RF light signal is passed through additional RF gain and filter circuitry 110 before being presented to a demodulator 112, which in an embodiment can perform rectification and synchronous detection. The essence of the separation of the detected ambient light signal from the detected RF light signal is that the detected ambient signal is low frequency and passes by filtering through the ambient channel 108, while the detected RF signal is high frequency and passes into the demodulator 112. The demodulator 112 chops and/or multiplies the detected RF signal in phase by a signal coming from timing circuits 114. The timing circuits 114 are driven by an oscillator 116. In an embodiment, the oscillator 116 is tuned to near the center of the band pass of the front end 106 and additional RF gain circuitry 110. Additional details of the front end 106, according to an embodiment of the present invention, are discussed below with reference to FIGS. 2 and 7. Additional details of the additional RF gain circuitry 110, according to an embodiment of the present invention, are discussed below with reference to FIG. 3.

The light detector 104 (which can also be referred to as a photo sensor, a photo detector or an optical detector) can include one or more light detecting element, such as, but not limited to, a photo resistors, photovoltaic cells, photodiodes, phototransistors, charge-coupled devices (CCD), or the like, that can be used to produce a current or voltage indicative of the magnitude of detected light. The light source 124 (which can also be referred to as an photo source or optical source)

can include one or more light emitting element, such as, but not limited to, light emitting diodes (LEDs), organic LEDs (OLEDs), bulk-emitting LEDs, surface-emitting LEDs, vertical-cavity surface-emitting lasers (VCSELs), super luminescent light emitting diodes (SLEDs), laser diodes, pixel diodes, or the like. The light source can produce IR light, or light of some other wavelength(s). Infrared light is often used because it is not visible.

The demodulator 112, which can be used for synchronous detection, outputs a signal having low frequency content proportional to the RF amplitude and including various high frequency artifacts. This signal is passed through a low pass filter 118 leaving only the low frequency content of the signal. This low frequency signal is essentially only a measure of the detected RF signal, originally produced by the light source 124 and reflected to the light detector 104. Very little low frequency content or ambient signal is present due to the filtering that has occurred in the front end 106 and RF gain stage 110 that blocks out low frequencies and passes the detected RF signal. Additional details of the demodulator 112 and the low pass filter 118, according to an embodiment of the present invention, are discussed below with reference to FIG. 4.

The low frequency signal output by the low pass filter 118 is passed into both a proximity channel 126 and a motion channel 128. In accordance with an embodiment, the low pass filter 118 has a cut off frequency of about 1 KHz, allowing the proximity channel 126 to respond to 'fast' motions. The motion channel 128 can perform additional low pass filtering in the range of about 1 Hz so as to increase the detection range for motion. Other cut-off frequencies and filtering ranges are also within the scope of the present invention. In an embodiment, the proximity channel 126 is essentially a direct coupled amplifier (DC amp) with low adjustable gain and an offset adjustment that can be set (e.g., through a serial interface 130 or a processor 140, or in another manner) in order to cause the minimum to maximum range of proximity detection to fall within the specified limits of the channel 126. The added gain of the proximity channel 126 when used for close object detection might be about 5×, since the detected RF light signal has already been amplified to obtain a large RF signal. However, if the proximity channel 126 is to be used for far object detection, it is useful to use the assistance of the motion channel 128 to help set the offset of the proximity channel 126 before the gain is increased. The output of the proximity channel 126 can be in this analog form, or pass optionally through one or more comparator (e.g., U7 and U8 in FIG. 5) to provide one or more digital output, or can be sent to an analog-to-digital (A/D) converter 136 where it can be accessed by the serial interface 130, the processor 140, or some other manner. Additional details of the proximity channel 126, according to an embodiment of the present invention, are discussed below with reference to FIG. 5.

The motion channel 128 also receives the same low frequency signal output by the low pass filter 118 that is essentially free of ambient light influence. It's purpose is to sense slight motion that results in changes in the light transmission between the light source 124 and the light detector 104. In an embodiment, the motion channel 128 does this by having a high gain and a controllable offset adjustment. The added gain in the motion channel 128 depends on how much gain was obtained in the RF gain stage 110, which depends on how much 'DC' reflection occurred. The gain can be increased until the thermal noise signal is substantial, e.g., about 30 mV. For a more specific example, if the RF gain is 2V/uA (limited by about a 500 nA static reflection), and the thermal noise level is 3 pA, the motion gain might be about 5000. Under this configuration the signal at the output of the motion channel 128 can be used to observe the noise signal coming from the front end 106.

The ambient feedback offset adjustment can be frozen to make the ambient channel 108 function as a very high gain proximity detector, or it can be slow to detect nominal motion changes in light transmission, or can be fast to recover quickly from large changes in the light transmission signal. Additional details of the motion channel 128, according to an embodiment of the present invention, are discussed below with reference to FIG. 6.

The oscillator 116, which can include a phase locked loop (PLL), is set to a frequency that can be but is not necessarily the same as the RF frequency of the signal produced by the light source 124. As a PLL, the oscillator 116 can be locked to an external clock so that multiple sensor systems can operate synchronously without causing interference. Optionally the system can produce a clock signal that can be the source of the external clock signal for other sensor systems. The timing circuits 114 receive an input from the oscillator 116 and receive control signals from the registers 132 and/or control logic 134 and/or the processor 140. Two main outputs of the timing circuits 114 are the signal that feeds the demodulator 112 and the signal that feeds the light source driver 120. The phases of these two signals can be but are not necessarily the same. For instance there can be a fairly sharp change in phase versus frequency through components processing the detected RF signal. Additionally, there may be a significant delay in the light source driver 120. Further, there may be a significant delay due to the distance between the light source 124 and objects (whose motion and/or proximity are being detected) and the light detector 104, where such a delay adds additional phase shift between the signal produced by the light source driver 120 and the signal output by the demodulator 112. In one possible mode of operation, the adjustment of the timing signals used in conjunction with the amplitude of signal observed from the demodulator 112 can be used to measure the time delay from the light source 124 to the light detector 104, and thus distance of an object. Other timing signals may control conversion performed by the A/D converter 136. In addition, the timing circuits may serve to reduce power consumption by operating the system at a low duty cycle.

The serial interface 130 can be of any type, including but not limited to Serial Peripheral Interface (SPI) and Inter-Integrated Circuit (I2C). The serial interface 130 can write to and read from parameter and control registers 132, as well as an optional A/D output register. The registers 132 can connect to various components within the system 102 to set gains, phases, and filter parameters. The A/D converter 136 can receive various analog inputs (e.g., from the motion channel 128, the proximity channel 126 and/or the ambient channel 108, etc.) and thereby output various digital outputs.

An optional processor 140 is also shown, which can perform and/or assist with various functions discussed herein. The processor 140 can be within the optical sensor system 102, or separate/remote but in communication with the optical sensor system 102.

Depending upon implementation, the light source 124 and/or the light detector 104 can be considered an integrated part of the optical sensor system 102, or can be considered to be separate/remote from the optical sensor system 102 yet controlled by and used by the optical sensor system 102.

Front End

Figure 2:
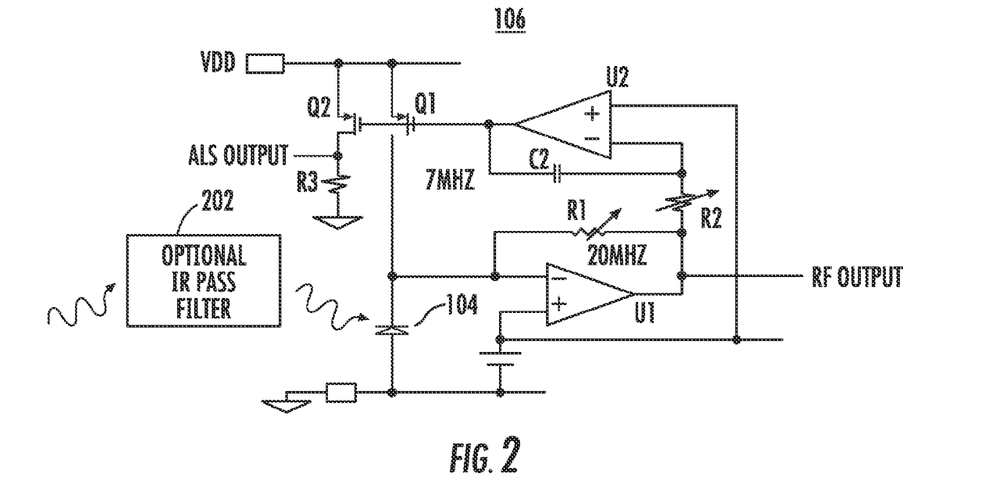
FIG. 2 is a circuit diagram of the front end of the optical sensor system of FIG. 1, according to an embodiment of the present invention.

FIG. 2 illustrates an implementation of the front end stage 106 (also simply referred to as the font end), according to an embodiment of the present invention. Portions of the circuit shown in FIG. 2 can also be considered part of the ambient channel 108, as will be appreciated from the discussion of FIG. 7 below. As mentioned above, light detected by the light detector 104 can include ambient light as well as light originating from the light source 124 driven by the light source driver 120 (which has been reflected off of one or more object), or driven by another circuit that drives the light source 124 in phase with the clock of the circuit. Where the light source 124 emits IR light, such light may pass through an optional IR filter 202 for increased separation between the RF IR light and ambient light. Although the optional IR filter 202 is not required, reducing the ambient component improves the RF signal-to-noise ratio (SNR). Also, as mentioned above the light source 124 can produce light other than IR light, in which case the pass band of the optional filter 202 may be different. In an embodiment, additionally, or alternatively, a lens is placed in front of the light detector 104 to increase sensitivity.

The light (that may or may not pass through the optional filter 202) is detected by the light detector 104, which may be integrated into the circuit 106 or be external. In an embodiment the light detector 104 (e.g., a photo diode) is integrated into the front end 106, which is believed to reduce the pick-up of radio frequency electro-magnetic signals. The light received by the light detector 104 is converted to a current signal (or alternatively a voltage signal) which can be referred to as the detected light signal. For the most part, the ambient light is low frequency light including sunlight, artificially generated light (e.g., intended to light a room or a street or sidewalk) and shadows from moving objects that may not be of interest. Accordingly, the ambient light can also include higher frequency variations from man made sources such as 100 Hz or 120 Hz light with various higher harmonics from lights driven directly from the power lines. The ambient light may also include even higher frequencies from florescent lighting driven with small transformer circuits in the 100 KHz frequency range and those harmonics. It is desired therefore that the RF frequency of the light source be driven at a frequency that is higher still so that a significant frequency gap exists between the ambient light and the light produced by the light source 124. Although higher frequencies are better for the above reasons, there are limitations imposed by power consumption, gain-bandwidth product of the amplifiers, and the response time of the light emitting element(s) of the light source. Thus the best RF frequency is a design choice, but it is suggested that the frequency should be above 1 MHz, and potentially up to about 10 MHz. There is an optimization with frequency. Higher frequencies provide better separation of the detected ambient light signal from the detected RF light signal, and tend to provide for a better signal-to-noise ration. However, higher frequencies are more difficult to handle and require higher power circuitry to process.

Assuming the light detector 104 produces a detected light signal that is a current (also referred to as a photo detector current or photo detector current signal), the detected light signal which is indicative of both detected ambient light and RF light is provided to the inverting (−) input of an amplifier U1, which causes a large rising voltage to occur at the output of the amplifier U1 in response to an increasing photo current. This voltage rise at the output of the amplifier U1 provides a feedback current through a resistor R1. Thus in the first part, the current light detector signal passes through the resistor R1 to provide an output voltage at the output of the amplifier U1.

The output of the amplifier U1 also connects to the inverting (−) input of a further amplifier U2 through a resistor R2. This gives rise to a falling voltage at the output of the amplifier U2 determined by the charging of a capacitor C2. This falling voltage at the output of the amplifier U2 then increases the conductance of transistors Q1 and Q2, and also feeds current back to the light detector 104 (e.g., a photo diode). In an embodiment, the transistor Q1 can be more complex than a single FET in order to control it's conductance and make it switchable in size. Because the output of the amplifier U2 changes slowly compared to the output of the amplifier U1, the high frequency components of the photo detector current passes through the resistor R1 to provide the detected RF output, while the lower frequency components pass through the transistor Q1 to provide the detected ALS output. Thus the slower (i.e., lower frequency) ambient signals are diverted into the transistor Q1, while the faster (i.e., high frequency) RF signal are diverted through the resistor R1.

The transistor Q1 can be of various sizes compared to the transistor Q2, and can be controlled by the control registers 132, by the processor 140 or alternatively by automatic switching circuits that respond to the size of the detected ambient light signal (ALS) output obtained at a resistor R3. Thus regardless of the size of the detected ambient light, it may all be absorbed by the transistor Q1. It should be noted that if the transistor Q1 is switched in size, that the R2 should also be switched in size so that the filtering characteristics remain essentially the same of the high pass filter provided by the loop including the amplifier U1, the amplifier U2, and the transistor Q1.

In summary, the front end 106 provides a mechanism whereby the high frequency components of the detected light signal (also referred to as the detected RF signal or RF output) is passed to the detected RF signal output (provided to the additional RF gain and filter circuitry 110), while the lower frequency ambient signal (also referred to as the detected ALS or ALS output) is passed to the ALS output (provided to the ambient channel 108).

Added RF Gain and Filtering

Figure 3:
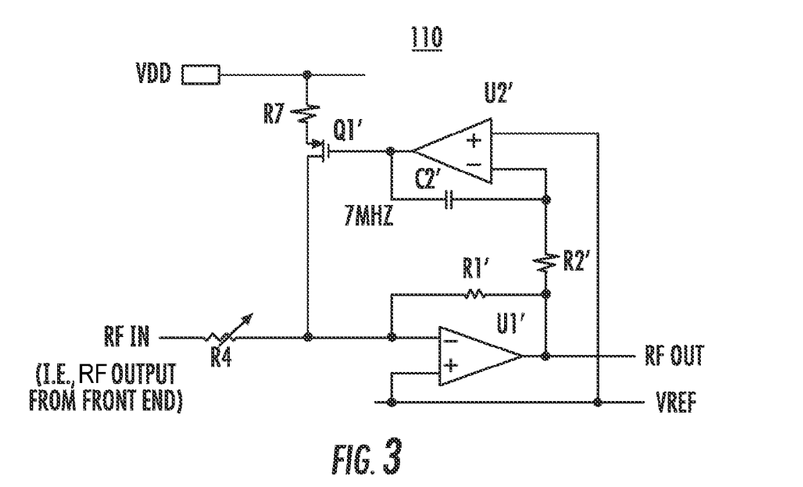
FIG. 3 is a circuit diagram of the RF gain and filtering circuitry of the optical sensor system of FIG. 1, according to an embodiment of the present invention.

FIG. 3 illustrates an embodiment of the added filtering and RF gain stage 110. The configuration is similar to the front end stage 106, but the light detector 104 is replaced by the voltage from the front end RF output (referred to as RF in) and a resistor R4. Where the components in FIG. 3 are the same or similar to those in FIG. 2, such components are designated the same but with a "prime", e.g., U2' in FIG. 3 is the same or similar to U2 in FIG. 2. The current through the resistor R4 includes an RF part and may include a residual low frequency part that may escape the front end stage 106 depending on its frequency. Thus the added filtering and gain stage 110 does two things: it provides additional RF gain and it provides an additional filter to further separate remnants of the detected ambient signal from the detected RF signal. Optionally a capacitor (not shown) may be added in series with the resistor R4 to provide further high pass filtering. However such a capacitance would need to be large to accommodate the small resistor R4, and would need to be changed if the resistor R4 were changed. The resistor R4 can be changed to control the gain of the added RF gain stage. Accordingly the resistor R4 (as well as the other resistors discussed herein) can be programmable to allow for such changing. Changing the resistor R4 does not have a significant impact on the filtering characteristics.

Demodulator and Low Pass Filter

Figure 4:
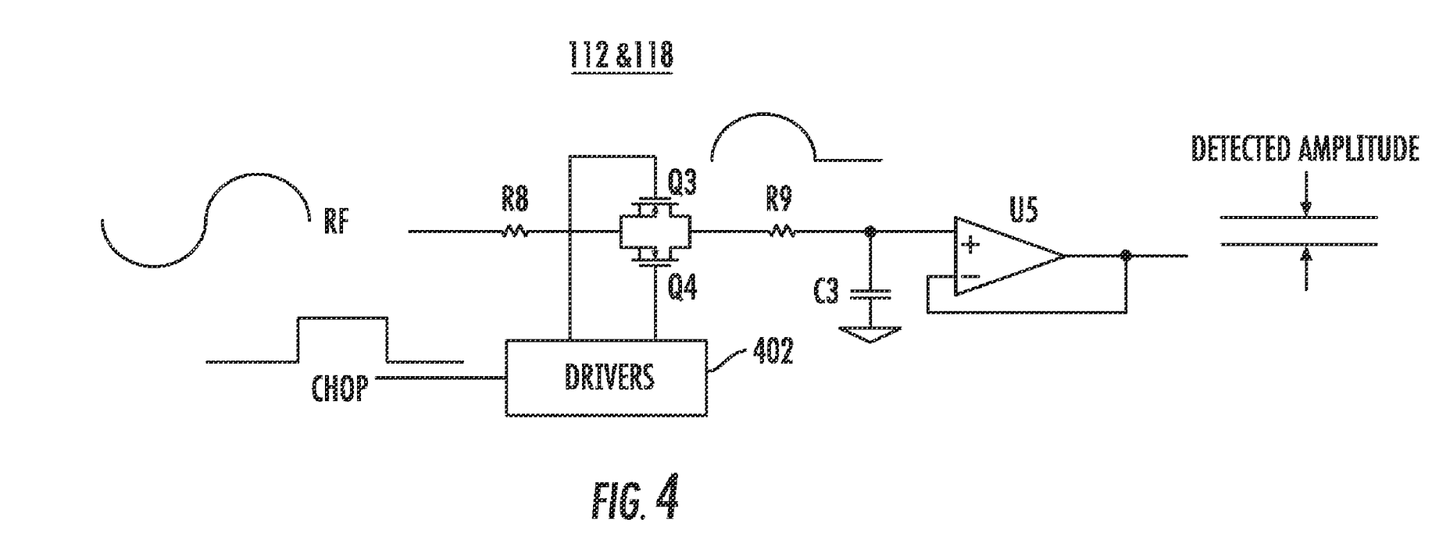
FIG. 4 is a circuit diagram of the demodulator and low pass filter of the optical sensor system of FIG. 1, according to an embodiment of the present invention.

FIG. 4 illustrates an embodiment of the demodulator 112 and the low pass filter 118. As mentioned above, the demodulator 112 can perform rectification and synchronous detection. The detected RF signal (output by the additional RF gain and filtering stage 110) is presented to the resistor R8, which serves as part of the low pass filter, and also as an isolation between the chopping transistors (e.g., FETs) Q3 and Q4 and the RF amplifier U1'. The CHOP signal coming from the timing circuits 114 in phase with the desired RF signal passes into FET drivers 402 which turn the FETs Q3 and Q4 on and off, allowing the detected RF signal to pass to a resistor R9 and a capacitor C3 where it is filtered. A unity-gain amplifier U5 is provided to buffer the filtered RF signal to the next stage. It should be pointed out that the detected RF signal can be considered to be composed of two components: one being the sum of all stationary reflections between the light source 124 and the light detector 104; and the other being the signal from the non-stationary target object to be detected. The stationary reflections are typically (but not necessarily) from close objects, while the non-stationary target object to be detected may be farther away. Thus the phase of the detected object may be delayed from the phase of the larger close 'cross talk' signals. In accordance with an embodiment, the CHOP signal is adjusted to be in phase with the typically weaker object signal. Many alternative configurations of chopper may be used. For example, a full wave chopper can pass the positive RF signal one way and the negative RF signal another way, and then combine the two results for increased gain. Another possibility is that the demodulator 112 performs a peak sample-and-hold followed by a low pass filter.

The frequency of the low pass filter 118 can be selected according to the bandwidth requirements of the proximity signal. The number of poles of roll-off in the low pass filter can be increased to reduce higher frequency noises. There is a trade-off between the cut-off frequency and the noise level.

Proximity Channel

Figure 5:
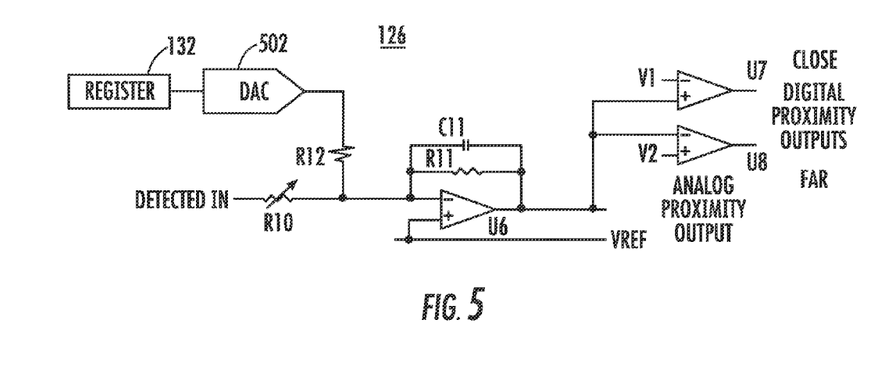
FIG. 5 is a circuit diagram of the proximity channel of the optical sensor system of FIG. 1, according to an embodiment of the present invention.

Depending upon the implementation, the proximity channel 126 can be used to simply detect the presence of a target object within the specified range of the optical sensor system 102 and/or the relative distance of the target object from the optical sensor system 102. FIG. 5 illustrates an embodiment of the proximity channel 126. The input to the proximity channel 126 is fed to a variable resistor R10 which sets the gain of an amplifier U6. The variable resistor R10 can be controlled by the control logic 134 and/or the processor 140 and/or via that serial interface 130 shown in FIG. 1, depending upon implementation.

A capacitor C11 and a resistor R11 set the low pass filter of the proximity channel 126. In other words, the amplifier U6 configured with the resistor R11 and the capacitor C11 forms an amplifying low pass filter. An additional low pass filter may be added to further reduce noise. The output of the amplifier U6 is the analog proximity signal, which is a measure of the RF amplitude that was detected. All other things being equal, generally the closer a target object is to the optical sensor system 102 the greater the RF amplitude. However, as described below, this can change as the operational range is adjusted, e.g., through adjustment of an offset.

One or more register (e.g., of registers 132, or another register), a digital-to-analog converter (DAC) 502 and a resistor R12 provide a programmable mechanism to control the offset of the amplifier U6, and thus the offset of the proximity channel. For example, these components can be controlled by the control logic 134 and/or processor 140 and/or via that serial interface 130 shown in FIG. 1, depending upon implementation, in order to control the offset of the amplifier U6. By allowing the flexibility of gain and offset, the operational range of the proximity can be tailored to a specific application. In FIG. 5, two comparators U7 and U8 are fed by either fixed or programmable voltages V1 and V2 to allow thresholds to be set and thereby a digital decision on if the proximity signal is high or low, representing a close proximity or far proximity. More or less comparators can be used, as desired.

In addition, the analog proximity output may be fed to the A/D converter 136 and read back by the processor 140, or made directly available on a pin for further analog processing.

Motion Channel

Figure 6:
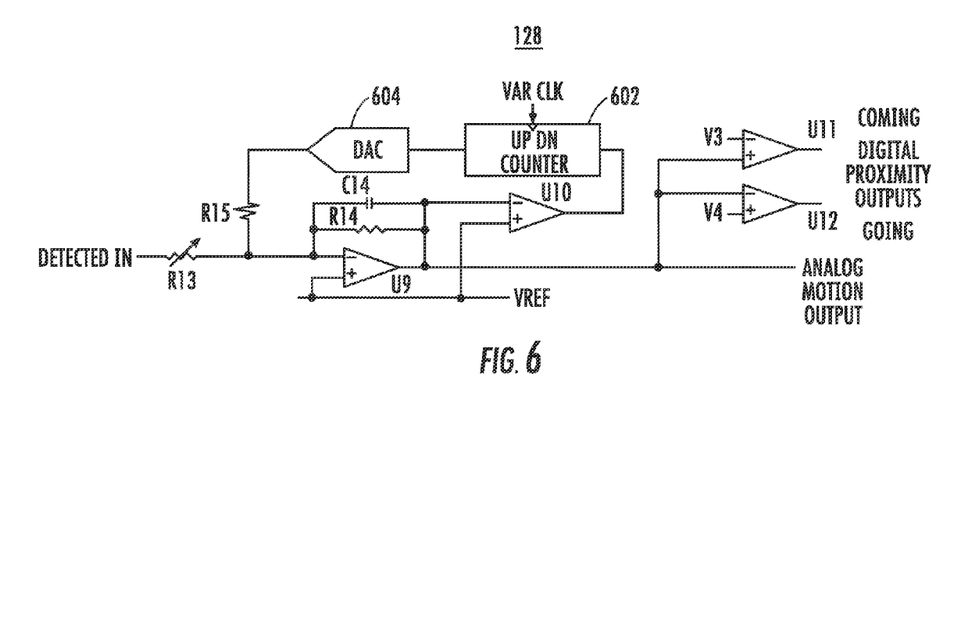
FIG. 6 is a circuit diagram of the motion channel of the optical sensor system of FIG. 1, according to an embodiment of the present invention.

FIG. 6 illustrates an embodiment of the motion channel 128. The input to the motion channel 128 is presented to the resistor R13, a variable or programmable resistor or a DAC, that in turn controls the current applied to the inverting (−) input of an amplifier U9. The amplifier U9 configured with a resistor R14 and a capacitor C14 forms an amplifying low pass filter. The output of the amplifier U9 is applied to a comparator U10, where it generates a logical up/down signal that is presented to an up/down counter 602. The up/down counter 602 is also fed a variable rate clock so that it will count up or down at a rate determined by the clock, and in a direction controlled by the output of the comparator U10. The rate of the variable rate clock (VAR CLK) can be controlled, e.g., by the processor 140. Thus the counter 602 will count up if the output of the comparator U10 is low representing a negative condition on the motion detector output, and count down if the output of the comparator U10 is high representing the condition of a positive motion detection signal. The output of the counter 602 is provided to a DAC 604, which applies a voltage to a resistor R15. When the counter 602 counts up, the output of the DAC 604 rises, adding current to the resistor R15, which then pushes the output of the motion amplifier U9 down. Thus the loop including the amplifier U9, the comparator U10, the up/down counter 602, the DAC 604 and the resistor R15 act to restore the output of the amplifier U9 to VREF. This restoration can be stopped, run slowly, or run quickly depending on the desire of the controller (e.g., the processor 140), which can change the VAR CLK. This feedback system essentially forms a high pass filter eliminating the DC component of the signal.

In an embodiment, the VAR CLK would first be run fast to get the output of the amplifier U9 down to VREF. Then it would be slowed down to a relatively low rate so that any drift in the detected signal would be cancelled out. Any fast change in the detected signal will cause the output of U9 to rise or fall, which can trigger one of the other comparators U11 or U12, which are also provided corresponding threshold voltages V3 and V4. In this way, if an object is approaching, the comparator U11 will output a positive signal, and if an object is going, the U12 comparator will output a positive signal. The analog motion output may also be fed to the A/D converter 136.

Differences between the proximity channel 126 and the motion channel 128 relate to gain and bandwidth. In the proximity channel 126, the gain would normally be low so that a wide range of position could be obtained without needing to change gain. The bandwidth could be higher because the gain is lower. The motion channel 128, on the other hand, is intended to have maximum gain and low bandwidth so that it can detect motion at the greatest distance. With the gain so high, there should be a convenient way to eliminate drift in the absolute size of the detected signal, and also a way to recover quickly if there is a sudden large change in the size of the detected signal. That is where the VAR CLK comes in, essentially doing automatically what the controller would have to do otherwise.

Ambient Channel

Figure 7:
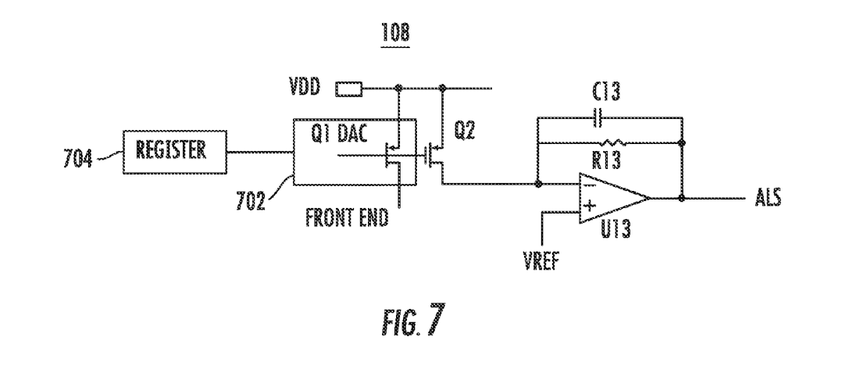
FIG. 7 is a circuit diagram used to describe the ambient channel of the optical sensor system of FIG. 1, according to an embodiment of the present invention.

FIG. 7, which includes some of the same circuitry shown in FIG. 2, is used to illustrate an implementation of the ambient channel 108, according to an embodiment of the present invention.

The Q1 DAC 702 and the transistor Q2 can be the low frequency feedback components from the front end stage 106. Here, Q1 can be made into a DAC (referred to as the Q1 DAC 702) by having Q1 be a plurality of transistors that are configured such that a selected number of the transistors can be connected in parallel to control the width of Q1. Then, assuming Q2 is fixed in width, the current through Q2 can be the current through Q1 times W2/W1, where W2 is the width of Q2 and W1 is the selected width of Q1. In accordance with an embodiment, the plurality of transistors of Q1 can be formed with binary widths, so that the total width of Q1 can be chosen directly with a binary number. A switching network (not shown) can enable the selection of the various Q1 widths. A register 704 (which can be one of the registers 132) can be programmed via the serial interface 130 and/or processor 140, to control such a switching network.

Here Q1 can be configured as a DAC, rather than a single transistor, to allow it to be sized to pass the required ambient current into the light detector 104 (e.g., a photo diode). For instance in direct sunlight a 1 mm square photo diode might source as much as 600 uA. But in the dark the ambient current could be negligible. By changing the conductance of the transistor Q1 relative to the transistor Q2, the Q1 DAC 702 can act as a range adjustment on the detected ambient signal. There is an advantage in the front end signal-to-noise ratio (SNR) when the conductance of the Q1 DAC 702 is minimized when the ambient is dark. The amplifier U13 configured with a resistor R13 and a capacitor C13 forms an amplifying low pass filter. By having the range adjustment DAC 702, the signal that passes from the transistor Q2 into the resistor R13 and the capacitor C13 can be made relatively fixed in size regardless of the ambient amplitude. The detected ALS can be fed to the A/D converter 136 to form the fine resolution of the detected ALS. The total ALS amplitude can be computed as the product of the Q1 DAC gain and the ALS A/D amplitude.

Because Q1 and Q2 have the same gate and source voltages, the currents of Q1 and Q2 are proportional to the sizes (e.g., widths) of Q1 and Q2, which enables these transistors to function as a gain stage. Because the width of Q1 is variable, Q1 and Q2 can also be referred to collectively as a variable gain stage.

In the embodiment of FIG. 7, the output of the ambient channel is shown as an analog output. One or more comparator can be used to produce a digital output, or an A/D converter (e.g., 136) can be used to produce the digital output. Alternative configurations are also possible.

Adjustment of Gains

There are many gain adjustments to the optical sensor system 102 that are possible, each of which can be adjusted to achieve a specific desired operation. As discussed below, the RF gain of the front end 106 can be fixed. However, for the front end 106 to operate properly the Q1 DAC 702 should preferably to be set at the proper level to allow the filtering of RF light from ambient light to occur. By observing the amplitude of the detected ALS through the A/D converter 136, the gain of the Q1 DAC 702 can be adjusted (e.g., by the processor 140). In an embodiment, if the amplitude of the detect ALS is below about $1/8^{th}$ of full scale, the gain of the Q1 DAC 702 is increased by decreasing the size (e.g., width) of Q1; and if the amplitude of the detected ALS amplitude is above about $1/4^{th}$ of full scale, the gain of the Q1 DAC 702 is decreased by increasing the size (e.g., width) of Q1. This provides room for the detected ambient light signal to fluctuate significantly and still be absorbed by the Q1 DAC 702.

Nominally, it may be advantageous if the first stage of gain of the front end 106 has a fixed gain suitable to handle the largest RF signal amplitude. This largest amplitude will occur when an object is reflecting a large amount of light from the light source 124 to the light detector 104. This would occur if a mirror were placed close to the light source 124 and light detector 104 so that it would appear as if the light source 124 were directly opposite and close to the light detector 104. If the light source (e.g., an LED) were emitting at 50 mW peak-peak and the image separation were 2 cm, and the LED spread angle were +/−30 degrees at half intensity, the photo current could be, e.g., about 240 uA peak-to-peak (pk-pk). Here, the resistor R1 of the front end 106 could be reduced to about 4K in order to keep the detected RF signal to 1V pk-pk. This 4K resistance is on the low side when it comes to detecting at a far distance. However, it is possible to reduce the amplitude of the light source signal in this case, which has the added benefit of reducing the power consumption. Therefore, in accordance with an embodiment the value of R1 can be kept fixed (e.g., at 200K), which could reduce the light source power to 1 mW rather than having to switch the value of the resistor R1. So a first adjustment can be the amplitude of the drive current to the light source 124 (e.g., an LED or other light emitting element(s)).

In order to know how to adjust the light source drive current, the size of the detected RF signal coming from the added RF stages should be considered. This is readily available from the proximity channel 126. Here, the offset of the proximity channel 126 can be left unchanged by applying VREF to the resistor R12 from the offset adjust DAC 502. Then the size of the proximity signal can be noted with the proximity gain set at 1× or 2×. If the proximity signal is too large, first the gains of the added RF stage 110 can be reduced. If the proximity signal is still too large when the added RF gain stage 110 is unity, then the light source drive current can be reduced, which can save power.

On the other hand, it might be that the size of the proximity signal is too small upon power up. Here, the procedure can be to first increase the gain of the added RF stage 110, and if that is not sufficient, to increase the drive current to the light source 124. Eventually that can max-out because the maximum RF gain and maximum light source drive current can be reached.

The gain of the motion detector channel 128 can be set as follows. An adjustment to the variable clock (VAR CLK) can be made so that the baseline voltage at the output of the motion detector channel 128 is being held to ground (i.e., zero) with a bandwidth of about 1 Hz. Then the gain of the motion detector channel 128 can be increased until the coming/going comparators U11 and U12 start to detect signals, or the gain has been maximized. If the coming/going comparators U11 and U12 have detected what is noise at this time, the gain of the motion detector channel 128 can be reduced by about ½. Thereafter the VAR CLK can be adjusted so that drift is being cancelled and motion is being detected. Where the light source casts light over a fairly wide angle, the nature of the motion detector channel 128 is that any movement beyond some distance will not present a large enough signal to be detected, confining motion detection to some radius.

It is desirable that the motion detector gain can be done automatically, even when some motion is occurring within the detection field. The above procedure works if no motion is occurring. Where the system knows that motion is occurring, the gain of the motion detector channel 128 could be seeking to adjust the gain always to a nominal noise level. Just as there can be an up-down counter used to keep the motion signal at VREF on the average, there can also be an up-down counter and a GAIN DAC to keep the motion output noise level at a nominal level less than the detection levels nominally on average. If the gain is not frozen, the motion detector channel 128 becomes a relative motion detector, which primarily enables larger motion to be detected.

A next adjustment can be adjustment of the gain and offset of the proximity channel 126. It has already been explained that the gain of the added RF gain stage 110 can be adjusted to get the size of the proximity channel 126 into a useable range. However this range might not be as sensitive as desired. What may be wanted is that the gain and offset of the proximity channel 126 is such that the near and far comparators U7 and U8 can occur at levels of about +/−0.5V from VREF, or that the ADC 136 is able to range from a useful minimum at about $1/4^{th}$ of full scale to a useful maximum at about $3/4^{th}$ of full scale. One way to obtain this gain and offset adjustment is by using an interaction between the user and the system. Starting at a low gain, a user can move an object (or themselves) between the close and far positions, and readings are taken from the ADC 136. From these two readings the adjustments of gain and offset can be calculated. However, because this method requires user intervention it may not be desired.

Given that the gain of motion channel 128 can be adjusted automatically to detect motion above the noise floor, it might be useful as an aid to automatically adjust the gain and offset of the proximity channel 126 automatically without user intervention. The motion channel 128 can detect target motion when within range. But, it cannot detect if the target object is out of range or stationary. Thus the only useful information the motion channel 128 provides is that if motion is detected, the target is within range, and the proximity signal is larger than the DC component of reflection. For discussion, assume that the ideal output of the proximity channel 126 is zero when the target is out of range. If the added offset is zero, the proximity channel 126 will have a positive output due to the fixed reflection. To reach the ideal condition, it is necessary to increase the added offset, thus reducing the output of the proximity channel 126 toward zero, when it is known that the target is present (when motion is detected by the motion channel 128). If the added offset is too large, the output of the proximity channel 126 will go negative. Thus the controller (e.g., the processor 14) of proximity offset can use an algorithm that increases the proximity offset if motion is detected and the proximity output is positive, and decreases the proximity offset if the proximity output is negative regardless of motion. Eventually the controller will find the correct offset. In summary, the combination of motion sensing and proximity sensing allows automatic gain and offset adjustment such that an object can be detected without user intervention in the calibration process. The processor 140 of some other controller can perform such an automatic calibration process. This is explained in some more detail below.

In accordance with an embodiment, a gain of the motion channel 128 is set greater than a gain of the proximity channel 126 so that a maximum distance at which the motion channel 128 can detect motion of an object is greater than a maximum distance at which the proximity channel 126 can detect presence of the object. This is because the motion channel 128 is AC coupled and can have a gain that is only limited by the thermal noise of the system, down into the pico amps of signal. But the proximity channel 126, because it is DC coupled, needs to handle the entire RF amplitude received, which is frequently in the range of hundreds of nano-amps.

In a common optical design, the transmitted RF light is allowed to spread over a wide range, e.g., 45 degrees. In this configuration, an object to be detected can provide a feedback signal to the light detector 104 that becomes less than the pico amp noise limit of the front end 106, when the object to be detected reaches a distance of about 1-2 meters. Thus in this configuration, the motion channel 128 can detect motion within about 1-2 meters range; but, the proximity channel 126 may still receives a large static signal from nearby stationary objects, including the apparatus in which the detector 104 is enclosed. One question that might be important in the above optical system, is if the object to be detected is within the detection range or not. The motion channel 128 can answer this question—if the detection object moves such as to change the reflected signal amplitude. But only the DC coupled proximity channel 126 can (in theory) make this determination if the detection object very slowly moves into or out of range. The potential problem is that the proximity channel 126 can only make this "in range" determination if the detection threshold is set to a few picoamps above the background hundreds of nanoamps. In order to make this determination, an offset should be subtracted from the low pass amplitude signal, followed by a large gain. This is where the motion channel 128 can aid the proximity channel 126. When motion is detected, the offset to the proximity channel 126 can be adjusted to produce a final proximity signal that is zero. The gain of the proximity channel 126 following the proximity offset adjustment can thus be increased. This is only one possible use of the proximity channel 126. Another use of the proximity channel 126 is for close object detection, where it is still useful to determine the proximity offset adjustment, but the gain of the proximity channel 126 remains low, so that large object signals can be measured and detected.

Exemplary Uses of Optical Sensor Systems

Figure 8:
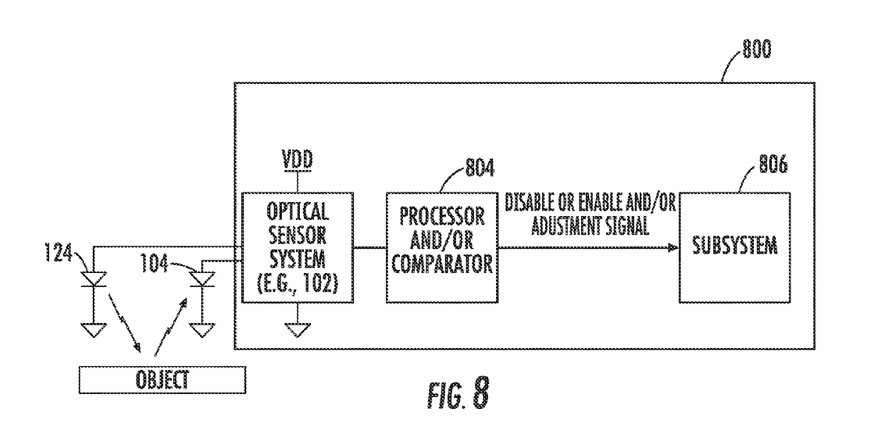
FIG. 8 is a high level block diagram of a larger system that includes an optical sensor system according to an embodiment of the present invention.

FIG. 8 is a high level block diagram of a larger system that includes an optical sensor system 102 according to an embodiment of the present invention. Optical sensor systems of embodiments of the present invention can be used in various larger systems, including, but not limited to, cell-phones, handheld-devices, computer systems and/or portions thereof (e.g., computer display monitors).

Referring to the system 800 of FIG. 8, for example, the optical sensor system 102 can be used to control whether a subsystem 806 (e.g., display screen, touch-screen, backlight, virtual scroll wheel, virtual keypad, navigation pad, etc.) is enabled or disabled, and/or the brightness of the subsystem. For example, the motion channel 128 and/or the proximity channel 126 of the optical sensor system 102 can detect when an object, such as a person's finger, is approaching, and based on the detection either enable (or disable) a subsystem 806. Additionally, the ambient channel 108 can be used to adjust a brightness of the subsystem 806 where appropriate. For example, one or more output of the optical sensor system 102 can be provided to a comparator and/or processor 804 which can, e.g., compare the output(s) of the optical sensor system 102 to one or more threshold, to determine whether the object is within a range where the subsystem 806 should be enabled (or disabled, depending on what is desired). Multiple thresholds can be used, and more than one possible response can occur based on the detected proximity of an object. For example, a first response can occur if an object is within a first proximity range, and a second response can occur if the object is within a second proximity range. It is also possible that functionality of the comparator and/or processor 804, or portions thereof, be included within the optical sensor system 102.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention.

What is claimed:

1. A system configured for ambient light detection, proximity detection and motion detection, the system comprising:
  a front end configured to
    receive a detected light signal generated using a light detector, wherein the detected light signal is indicative of both detected ambient light as well as detected radio frequency (RF) pulsed light produced by a light source pulsed at an RF frequency;
    output a detected ambient light signal primarily indicative of the portion of the detected light signal that is indicative of detected ambient light; and
    output a detected RF light signal primarily indicative of the portion of the detected light signal that is indicative of the detected RF pulsed light;
  an ambient channel configured to produce one or more ambient output signal indicative of the detected ambient light in dependence on the detected ambient light signal;
  a proximity channel configured to produce one or more proximity output signal indicative of proximity of an object relative to the system, in dependence on the detected RF light signal; and
  a motion channel configured to produce one or more motion output signal indicative of motion of an object relative to the system, in dependence on the detected RF light signal.

2. The system of claim 1, wherein the detected RF pulsed light can be due to light produced by the light source that has reflected off of one or more stationary object as well as light produced by the light source that has reflected off of one or more moving object.

3. The system of claim 1, further comprising:
  circuitry configured to amplify and filter the detected RF light signal and to output an amplified and filtered RF light signal that is provided to both the proximity channel and the motion channel.

4. The system of claim 3, wherein the circuitry configured to amplify and filter the detected RF light signal comprises:
  gain circuitry configured receive the detected RF light signal from the front end and amplify the detected RF light signal;
  a demodulator configured to receive the signal output by the gain circuitry and output a signal having low frequency content proportional to the RF amplitude of the amplified RF light signal and including high frequency artifacts; and
  a low pass filter configured to receive the signal output by the demodulator and output a signal indicative of the low frequency content of the amplified RF light signal with the high frequency artifacts filtered out;
  wherein the proximity channel and the motion channel each receive the signal output by the low pass filter.

5. The system of claim 4, further comprising:
  a driver configured to drive the light source such that the light source produces a pulsed light signal having the RF frequency; and
  one or more timing circuit configured to control timing of the demodulator and the driver.

6. The system of claim 5, wherein the one or more timing circuit drives the light source such that the light source produces an RF pulsed light signal having a frequency of at least 1 MHz.

7. The system of claim 6, wherein a gain of the motion channel is set greater than the gain of the proximity channel.

8. The system of claim 7, wherein the gain of the motion channel is set as high as noise allows so as to detect target motion at a maximum distance.

9. The system of claim 1, wherein offset and gain of the proximity channel is adjusted based on motion detected by the motion channel.

10. The system of claim 9, further comprising:
  a controller configured to control the offset and the gain of the proximity channel based on motion detected by the motion channel;
  wherein the controller is implemented using control logic, a processor and/or a serial interface.

11. A system configured for proximity detection and motion detection, the system comprising:
  a front end configured to
    receive a detected light signal generated using a light detector, wherein the detected light signal is indicative of both detected ambient light as well as detected radio frequency (RF) pulse light produced by a light source pulsed at an RF frequency; and
    output a detected RF light signal primarily indicative of the portion of the detected light signal that is indicative of detected RF light;
  a proximity channel configured to produce one or more proximity output signal indicative of proximity of an object relative to the system, in dependence on the detected RF pulsed light signal or an amplified and/or filtered version thereof; and
  a motion channel configured to produce one or more motion output signal indicative of motion of an object relative to the system, in dependence on the detected RF light signal or an amplified and/or filtered version thereof.

12. The system of claim 11, wherein a gain of the motion channel is set greater than the gain of the proximity channel.

13. The system of claim 12, wherein the gain of the motion channel is set as high as noise allows so as to detect target motion at a maximum distance.

14. The system of claim 11, wherein offset and gain of the proximity channel is adjusted based on motion detected by the motion channel.

15. The system of claim 14, further comprising:
  a controller configured to control the offset and the gain of the proximity channel based on motion detected by the motion channel;
  wherein the controller is implemented using control logic, a processor and/or a serial interface.

16. A method for ambient light detection, proximity detection and motion detection, the method comprising:
  (a) receiving a detected light signal generated using a light detector, wherein the detected light signal is indicative of both detected ambient light as well as detected radio frequency (RF) pulsed light produced by a light source pulsed at an RF frequency;
  (b) producing, based on the received the detected light signal, a detected ambient light signal and a detected RF light signal,
    wherein the detected ambient light signal is primarily indicative of the portion of the detected light signal that is indicative of detected ambient light, and
    wherein the detected RF light signal is primarily indicative of the portion of the detected light signal that is indicative of the detected RF pulsed light;
  (c) providing the detected RF light signal or an amplified and/or filtered version thereof to both a proximity channel and a motion channel;

(d) using the proximity channel to produce a proximity output signal indicative of proximity of an object relative to the system, based on the detected RF light signal or the amplified and filtered version thereof; and (e) using the motion channel to produce one or more motion output signal indicative of motion of an object relative to the system, based on the detected RF light signal or the amplified and/or filtered version thereof.

17. The method of claim 16, wherein the detected RF pulsed light has a higher frequency than the detected ambient light.

18. The method of claim 16, wherein the detected RF pulsed light is synchronously detected.

19. The method of claim 16, further comprising adjusting offset and gain of the proximity channel based on motion detected by the motion channel.

20. The method of claim 16, wherein:

step (d) comprising using the proximity channel to produce the proximity output signal indicative of proximity of an object relative to the system, based on an amplitude of the detected RF light signal or the amplified and filtered version thereof; and step (e) comprises using the motion channel to produce one or more motion output signal indicative of motion of an object relative to the system, based on an amplitude of the detected RF light signal or the amplified and/or filtered version thereof.

* * * * *